United States Patent
Inaba et al.

(10) Patent No.: US 8,333,010 B2
(45) Date of Patent: Dec. 18, 2012

(54) ELECTRONIC COMPONENT MOUNTING APPARATUS

(75) Inventors: Yuzuru Inaba, Yamanashi (JP); Osamu Okuda, Mie (JP); Yuji Tanaka, Yamanashi (JP); Tetsutaro Hachimura, Yamanashi (JP)

(73) Assignee: Panasonic Corporation, Osaka (JP)

( * ) Notice: Subject to any disclaimer, the term of this patent is extended or adjusted under 35 U.S.C. 154(b) by 5 days.

(21) Appl. No.: 12/936,752

(22) PCT Filed: Mar. 30, 2009

(86) PCT No.: PCT/JP2009/001436
§ 371 (c)(1),
(2), (4) Date: Oct. 7, 2010

(87) PCT Pub. No.: WO2009/125550
PCT Pub. Date: Oct. 15, 2009

(65) Prior Publication Data
US 2011/0030201 A1 Feb. 10, 2011

(30) Foreign Application Priority Data
Apr. 10, 2008 (JP) .................................. 2008-102271

(51) Int. Cl.
*B23P 19/00* (2006.01)
(52) U.S. Cl. ................ 29/740; 29/741; 29/742; 29/429; 29/564.1; 198/465.1
(58) Field of Classification Search ............... 29/729, 29/739–743, 719–721, 833, 759; 198/468.2; 414/416.01, 737; 901/47; 294/64.1
See application file for complete search history.

(56) References Cited

U.S. PATENT DOCUMENTS

| | | | | |
|---|---|---|---|---|
| 5,208,969 A | * | 5/1993 | Hidese | 29/740 |
| 5,588,195 A | * | 12/1996 | Asai et al. | 29/33 M |
| 5,867,897 A | * | 2/1999 | Mimura et al. | 29/840 |
| 5,938,871 A | * | 8/1999 | Nakahira et al. | 156/64 |
| 6,389,683 B1 | * | 5/2002 | Mori et al. | 29/740 |
| 6,519,838 B1 | * | 2/2003 | Okuda et al. | 29/740 |
| 6,735,856 B1 | * | 5/2004 | Kitamura et al. | 29/833 |
| 6,988,612 B1 | * | 1/2006 | Kabeshita et al. | 198/817 |
| 7,219,787 B2 | * | 5/2007 | Kabeshita et al. | 198/346.2 |
| 7,488,283 B2 | * | 2/2009 | Yasui | 483/1 |
| 2006/0085973 A1 | * | 4/2006 | Kodama et al. | 29/740 |

FOREIGN PATENT DOCUMENTS

| | | |
|---|---|---|
| JP | 4-37088 A | 2/1992 |
| JP | 2002-059056 A | 2/2002 |
| JP | 2004-311599 A | 11/2004 |
| JP | 2007-281227 A | 10/2007 |

OTHER PUBLICATIONS

International Search Report for PCT/JP2009/001436; Apr. 21, 2009.

* cited by examiner

*Primary Examiner* — Minh Trinh
(74) *Attorney, Agent, or Firm* — Pearne & Gordon LLP

(57) ABSTRACT

In an electronic component mounting apparatus that is used in an electronic component mounting line for producing a mounted substrate by mounting electronic components on a substrate and that subjects the substrate to predetermined operation, a working unit attachment section 30 is provided within a range of movement of a working head, such as a loading head and a paste trial coating head, wherein a nozzle stocker 9 and a paste trial coating unit 10 can be removably attached as a working unit for performing specific additional operation appropriate for working function of the working head. The nozzle stoker 9 and the paste trial coating unit 10 are attached to the working unit attachment section 30 according to the type of working head.

2 Claims, 7 Drawing Sheets

ELECTRONIC COMPONENT MOUNTING APPARATUS

TECHNICAL FIELD

The present invention relates to an electronic component mounting apparatus used in an electronic component mounting line that produces a mounted substrate by mounting electronic components on a substrate as well as to a viscous material trial coater used in the electronic component mounting apparatus in order to subject a substrate to trial coating of a viscous material.

BACKGROUND ART

An electronic component mounting line that produces a mounted substrate by mounting electronic components on a substrate is built by coupling together a plurality of pieces of electronic component mounting apparatus having different working functions, such as coater that coat a substrate with a viscous material like electronic component bonding paste and an adhesive and component loaders that mount electronic component on coated substrates. Such an electronic component mounting apparatus is configured so as to subject a substrate to predetermined operation, such as component loading operation and operation for applying a viscous material, performed by an individual machine through use of a working head provided in the individual machine, such as a component loading head and a coating head, while conveying the substrate from an upstream position to a downstream position by means of a substrate conveyance mechanism having a common configuration.

In addition to main operation performed as original operation by the working head, various additional operations incidental to the main operation are also included in such an operation performed by the individual machine. For instance, operation for transferring and loading electronic components on a substrate by means of a component loading head requires, as additional operation, nozzle replacement operation for replacing a component suction nozzle attached to the component loading head according to a type of electronic components to be mounted. Moreover, operation for coating a substrate with a viscous material by means of the coating head requires, as additional operation, trial coating operation for ascertaining whether or not an appropriate amount of paste to be applied is actually applied by a coating nozzle, before performance of coating operation.

Performing such additional operation involves a need for custom-designed working units appropriate for specifics of respective operations as well as working heads. In order for; e.g., a coater, to perform trial coating operation, there is employed a trial coater equipped with a coating stage for performing actual coating operation in a trial manner (see Patent Document 1). In the embodiment described in connection with the patent document, an electronic component mounting apparatus having both a component loader and a coater is to be equipped with, as a trial coater, a sacrificial coating station attached to a part of an install seat used for attaching component feed device.

Patent Document 1: JP-A-2002-59056

DISCLOSURE OF THE INVENTION

Problem That the Invention is to Solve

Producing multiple products in small quantities has recently become a mainstream production style even in the electronic industry, and production facilities also have become required to have a facility configuration that exhibits both high production efficiency and flexibility compatible with a various production styles. Specifically, in addition to the capability of a single machine to enable production of multiple products required for a related-art electronic component mounting line, there has also been demanded a machine layout that makes it possible to divert a single unit to a unit for different operation, too. In order to fulfill such a demand, selective attachment of a working unit having different functions for the foregoing additional operations has also become required according to a function of a working head.

However, the related-art electronic component mounting apparatus, including the example related art described in connection with the patent document, is not given a configuration that enables arrangement of working units for additional operations by means of a rational system or in a rational layout in correspondence with the working head and that enables replacement of the unit with superior operability. For instance, in the embodiment described in connection with Patent Document 1, a sacrificial coating station having a custom-designed drive mechanism serving as a trial coater is arranged so as to occupy an install seat to which a tape feeder is to be originally attached. Thus, the station cannot be said to have an apparatus form suitable for diverting a single unit to a unit for different operation.

Accordingly, the present invention aims at providing an electronic component mounting apparatus suitable for diverting a single unit to a unit for different operation and a viscous material trial coater that is used in conjunction with the electronic component mounting machine and that enable replacement of a working unit of another type with superior operability.

Means for Solving the Problem

An electronic component mounting apparatus of the present invention corresponds to an electronic component mounting apparatus that is used in an electronic component mounting line for producing a mounted substrate by mounting electronic components on a substrate and that subjects the substrate to predetermined operation, the apparatus comprising: a substrate conveyance mechanism for conveying the substrate along a conveyance path, a substrate positioning section provided along the conveyance path to position and hold the substrate, a working head that subjects the positioned substrate to the operation, and a working head moving mechanism for moving the working head, which has been selected from a plurality of types of working heads and is replaceably attached, in order to perform the operation; and a working unit attachment section that is provided in a range where the working head moving mechanism moves a working head and to which there is removably attached a working unit for performing specific, additional operation according to working function of the working head.

A viscous material trial coater of the present invention corresponds to a viscous material trial coater in an electronic component mounting apparatus used in an electronic component mounting line that produces a mounted substrate by mounting electronic components on a substrate, the coater subjecting the substrate to trial coating of a viscous material prior to coating operation for coating the substrate with the viscous material, the viscous material trial coater comprising: a removable unit that is removably attached to a working unit attachment section provided in the electronic component mounting apparatus; a coating stage that is provided in the removable unit and that is for applying a viscous material on a trial coating sheet in a trial manner and a sheet feed mechanism that is actuated by a drive source provided in the working unit attachment section and that feeds the sheet to the coating stage; and drive transmission device that removably couples the sheet feed mechanism and the drive source together and that transmits drive force to the sheet feed mechanism.

Advantage of the Invention

According to the present invention, there is provided a working unit attachment section that is provided within a range where a working head moving mechanism moves a working head and to which a working unit intended for performing a specific additional operation corresponding to working function of the working head is removably attached, thereby diverting a single unit into a unit for different operation.

DESCRIPTIONS OF THE REFERENCE NUMERALS AND SYMBOLS

2 SUBSTRATE CONVEYANCE MECHANISM
3 SUBSTRATE POSITIONING SECTION
4 SUBSTRATE
5A COMPONENT LOADING MECHANISM
5B PASTE COATING MECHANISM
6 COMPONENT FEED SECTION
9 NOZZLE STOCKER
10 TRIAL COATING UNIT
16 LOADING HEAD
18 PASTE COATING HEAD
19 SUBSTRATE RECOGNITION CAMERA
22A, 22B ATTACHMENT BASE
23 SUCTION NOZZLE
24 ELECTRONIC COMPONENT
25 COATING UNIT
34 CYLINDER
35 DRIVE MEMBER
36 SENSOR UNIT
37 DOG UNIT
51 SHEET FEED REEL (FEED ROLL ATTACHMENT SECTION)
52 SHEET TAKE-UP REEL (TAKE-UP REEL ATTACHMENT SECTION)
53 COATING STAGE
54 SHEET
54a FEED ROLL
54b TAKE-UP ROLL
57 RACK
58 COUPLING MEMBER
63 PINION

BEST MODE FOR IMPLEMENTING THE INVENTION

Figure 1:
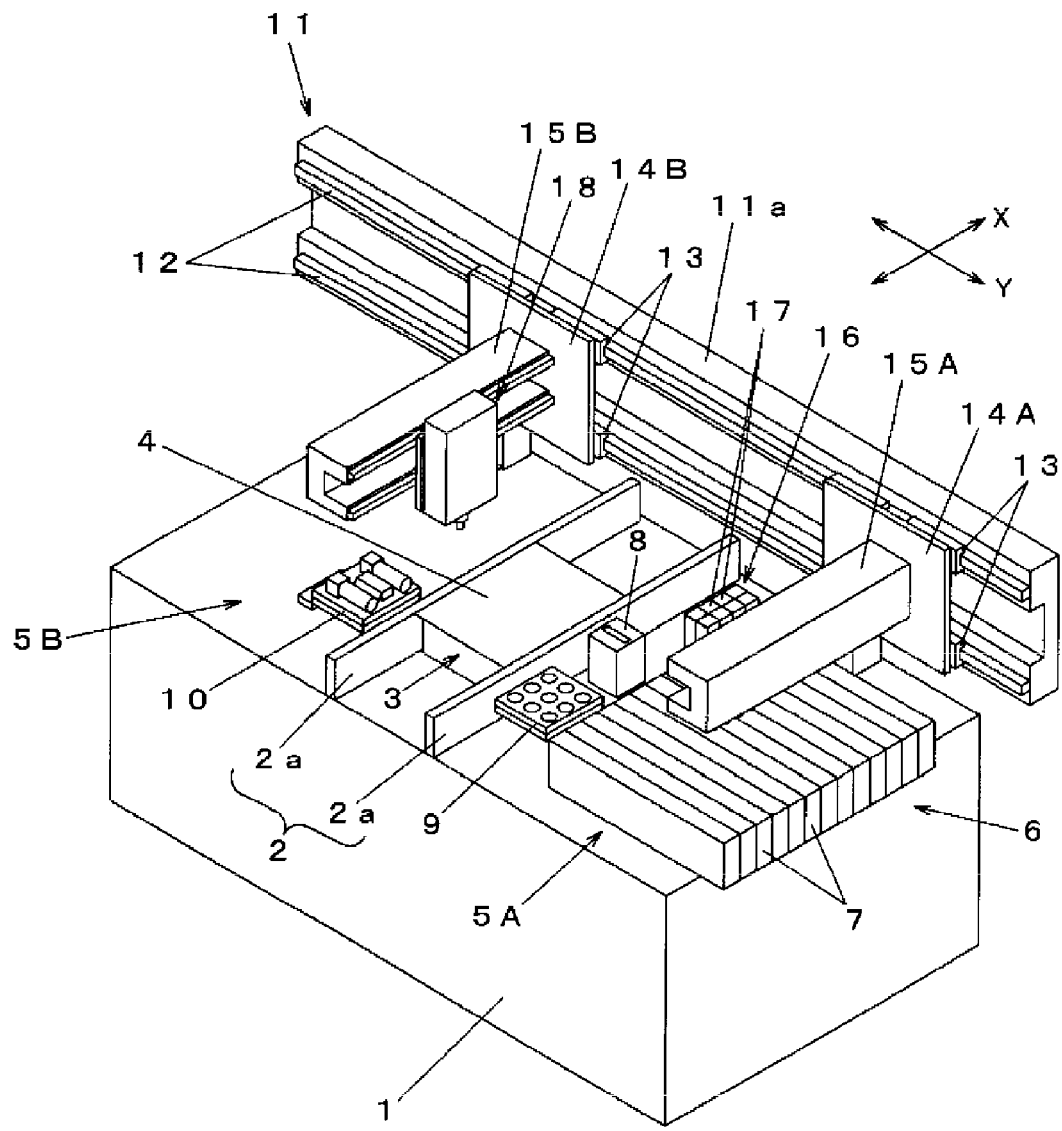
FIG. 1 is an oblique perspective view of an electronic component mounting apparatus of an embodiment of the present invention.
Figure 2:
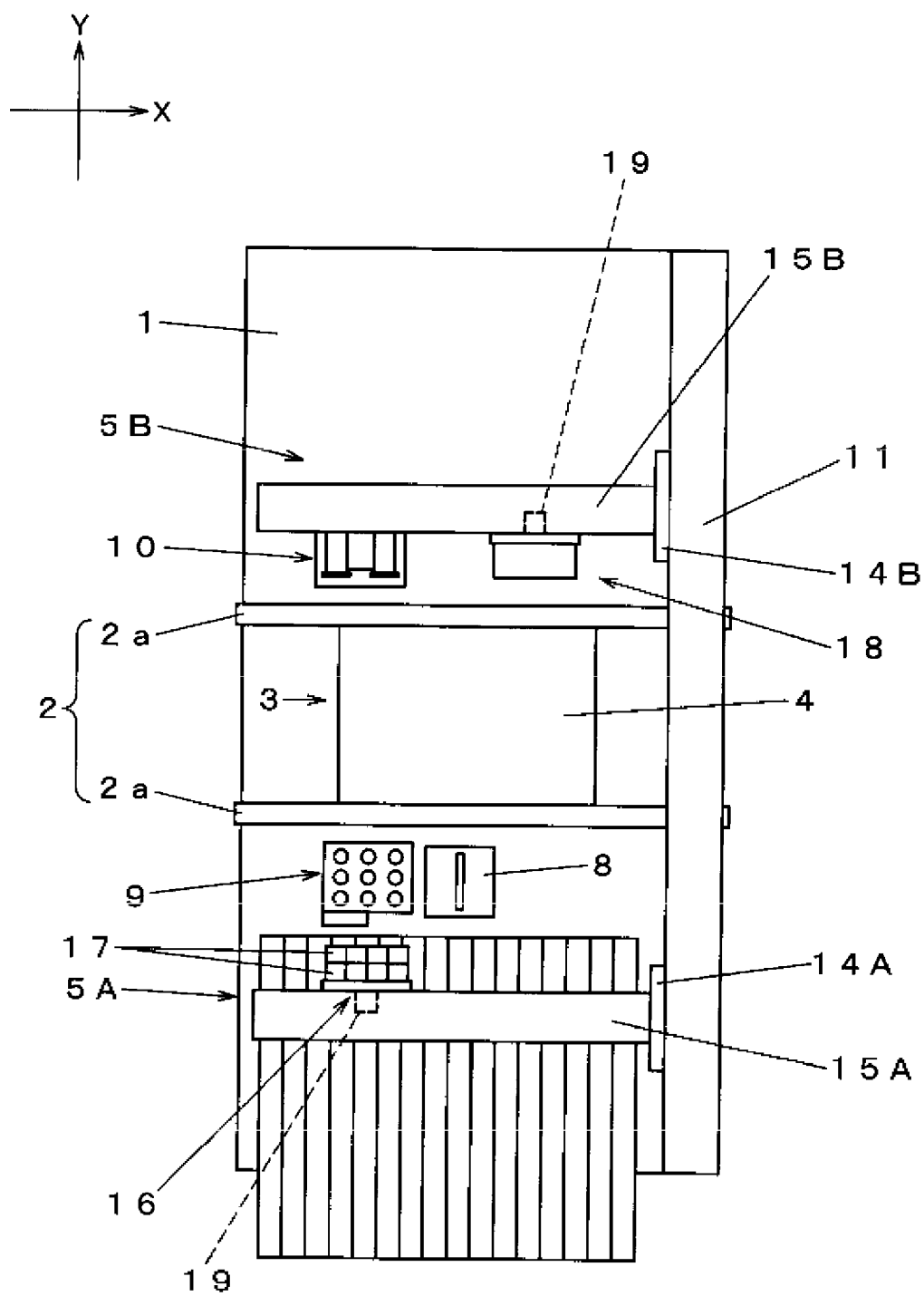
FIG. 2 is a plan view of the electronic component mounting apparatus of the embodiment of the present invention.
Figure 3:
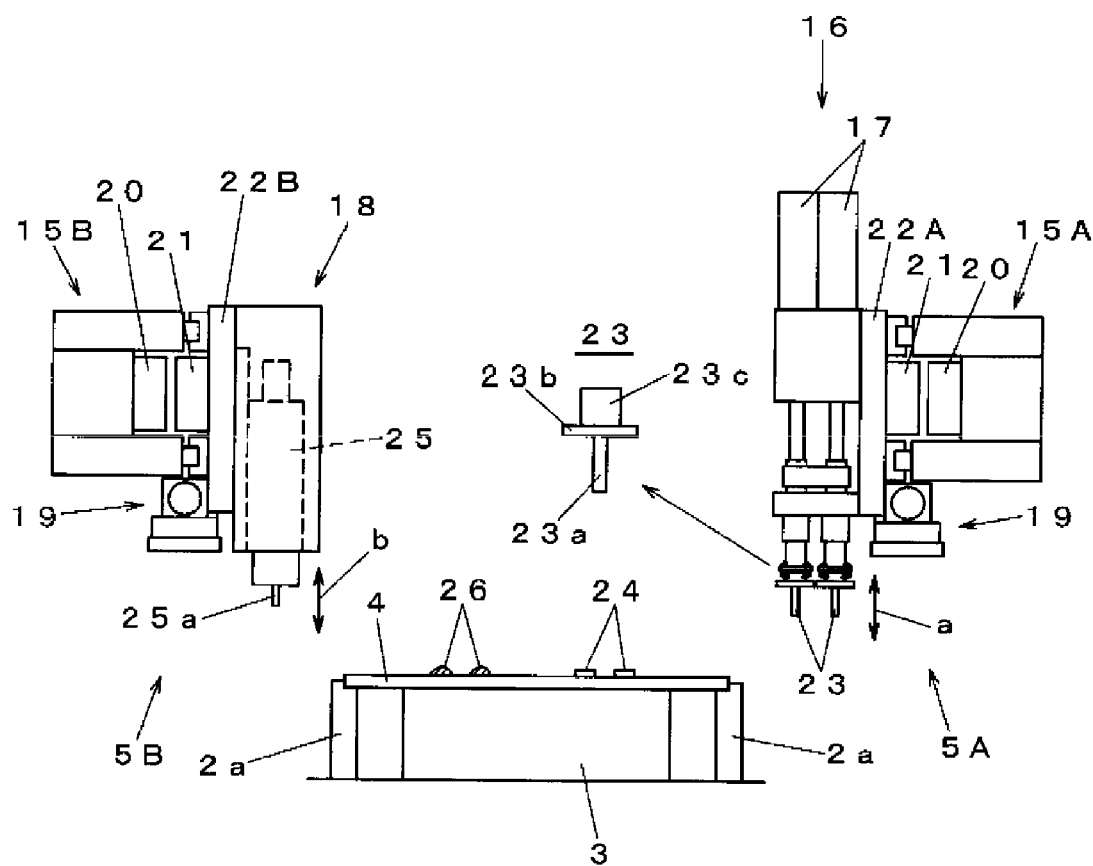
FIG. 3 is a partially cross-sectional view of the electronic component mounting apparatus of the embodiment of the present invention.
Figure 4:
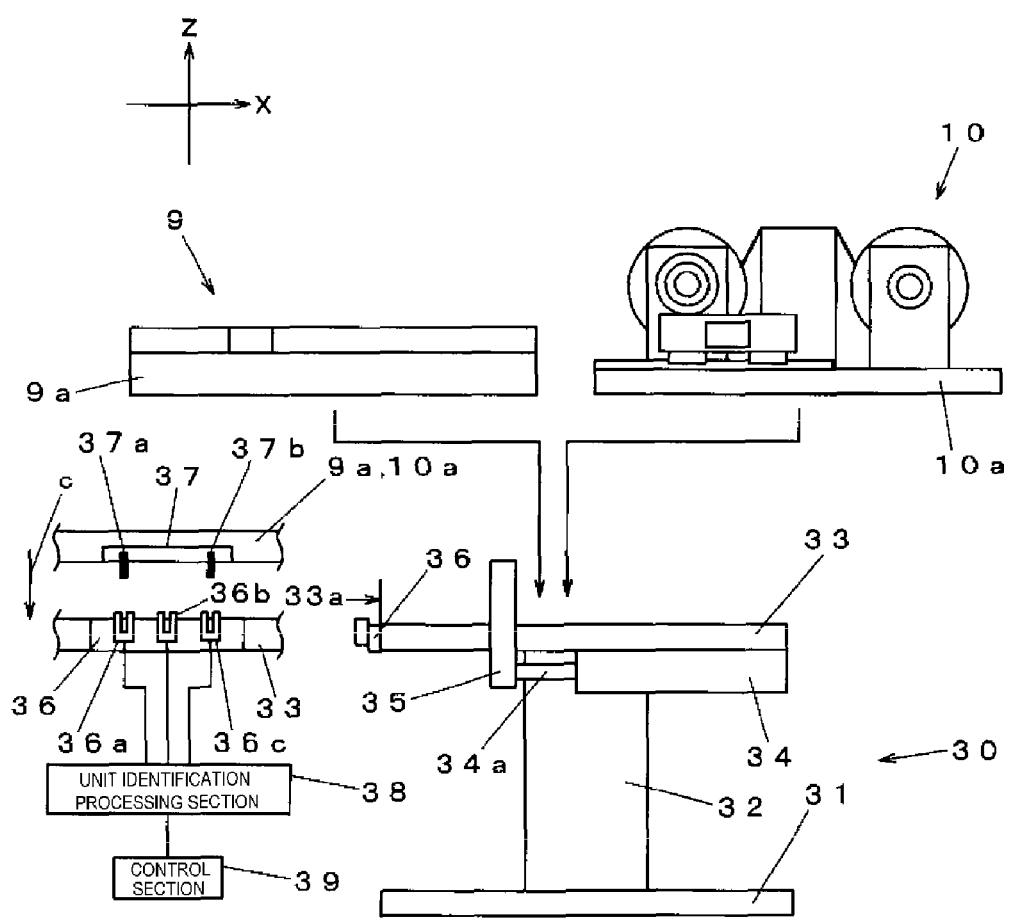
FIG. 4 is a descriptive view of a structure of a working unit attachment section in the electronic component mounting apparatus of the embodiment of the present invention.
Figure 5:
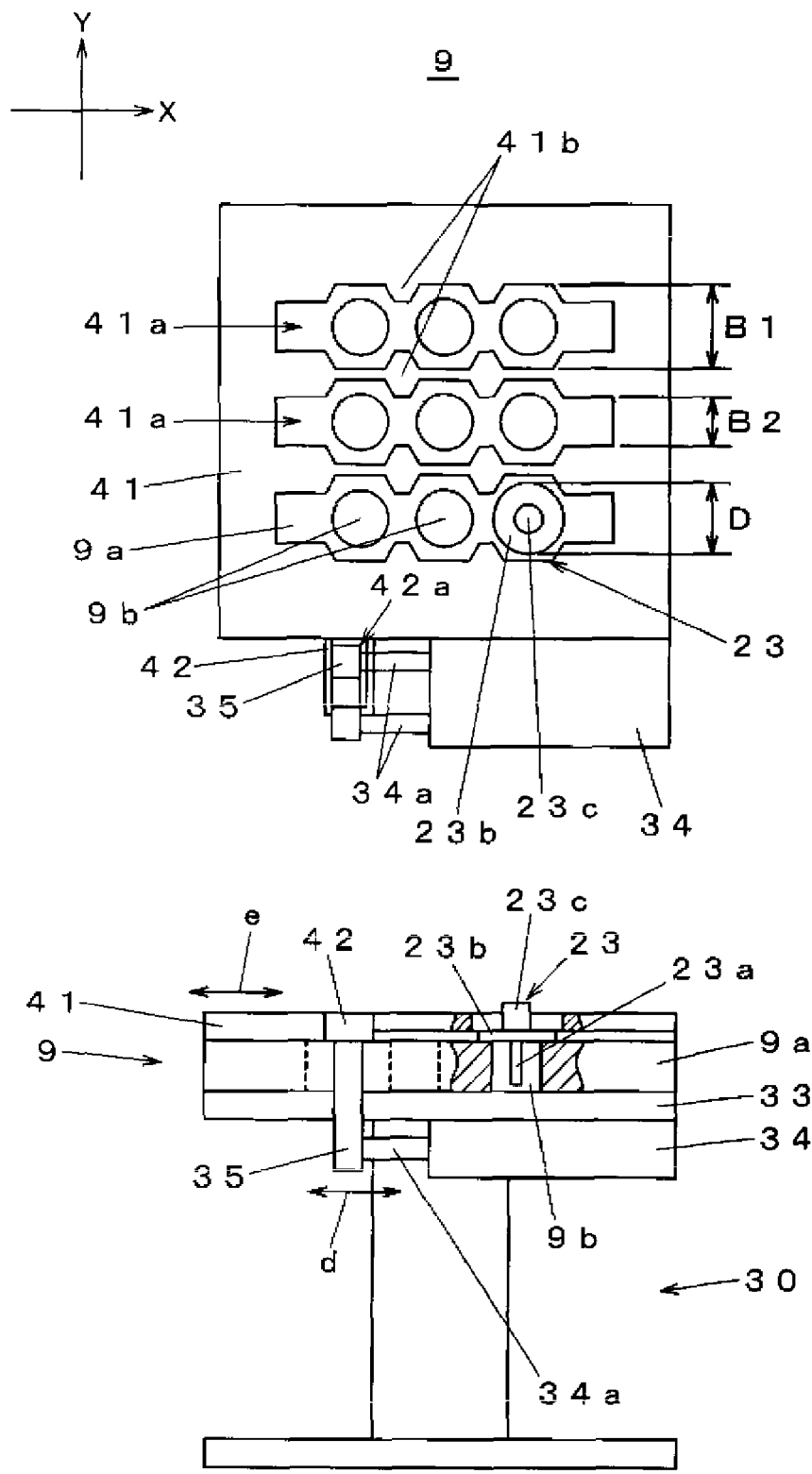
FIG. 5 is a structural descriptive view of a nozzle stocker of the electronic component mounting apparatus of the embodiment of the present invention.
Figure 6:
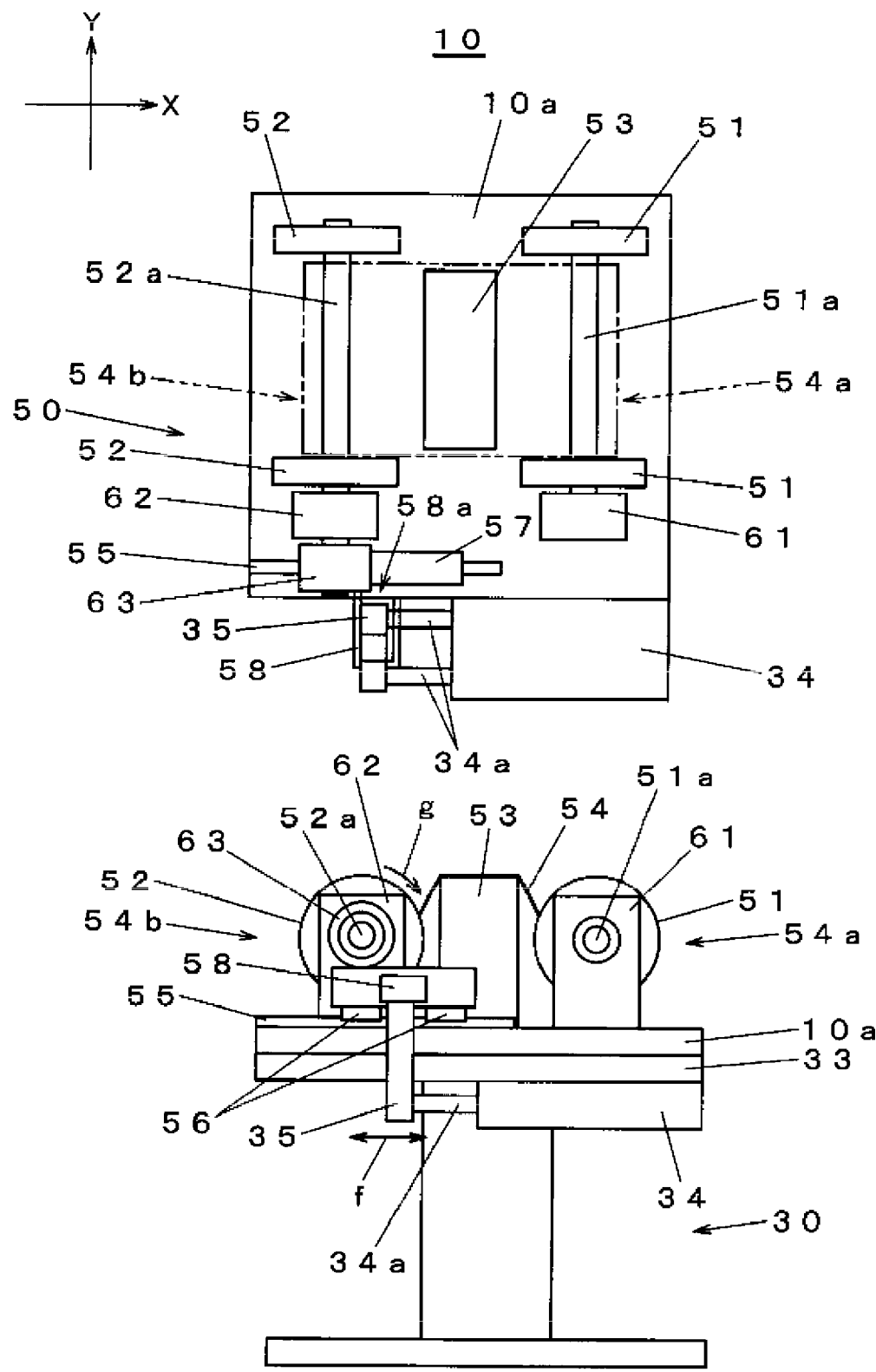
FIG. 6 is a structural descriptive view of a viscous material trial coater in the electronic component mounting apparatus of the embodiment of the present invention.
Figure 7:
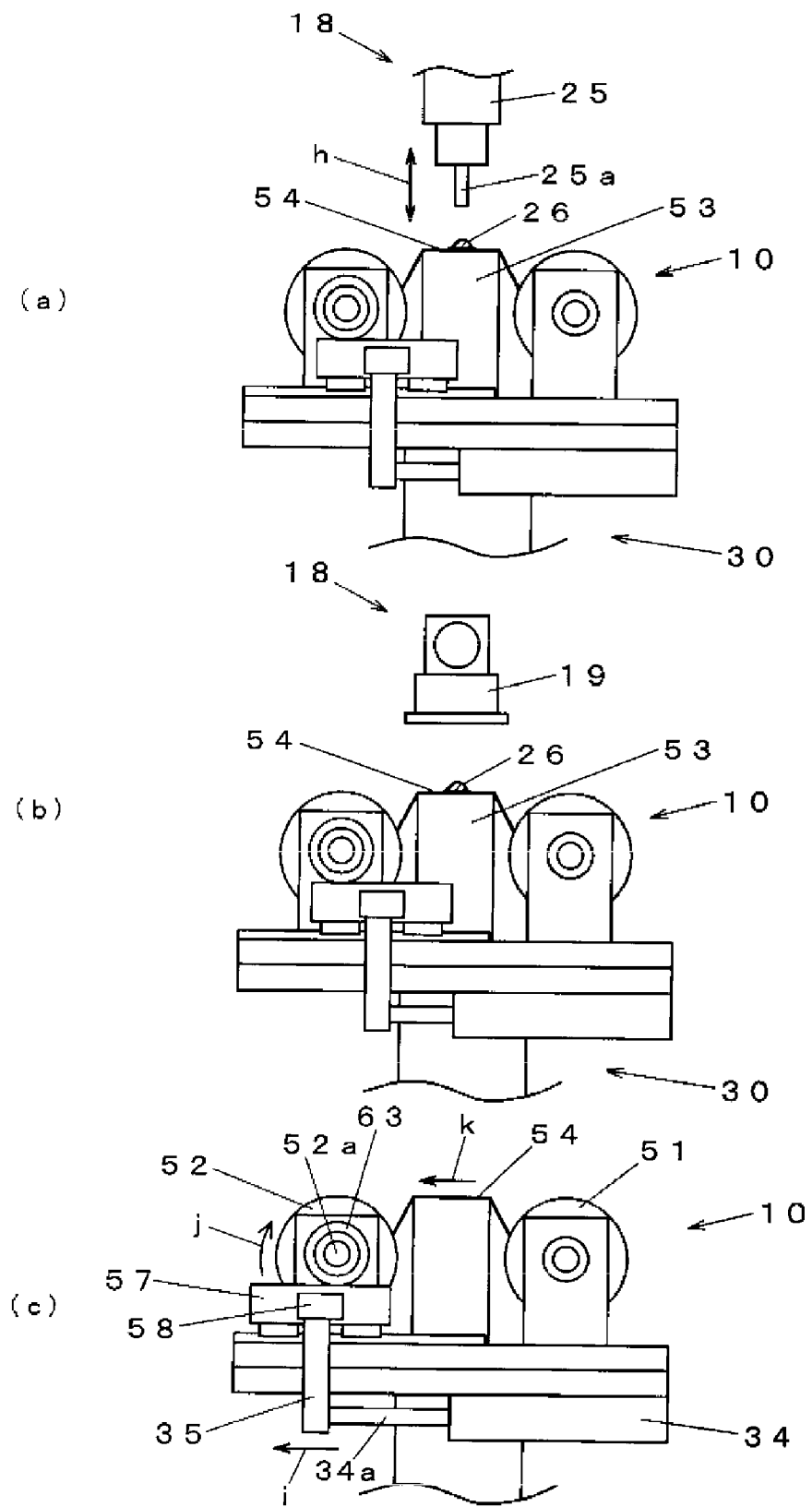
FIG. 7 is an operation descriptive view of the viscous material trial coater of the electronic component mounting apparatus of the embodiment of the present invention.

An embodiment of the present invention is now described by reference to the drawings. FIG. 1 is an oblique perspective view of an electronic component mounting apparatus of an embodiment of the present invention; FIG. 2 is a plan view of the electronic component mounting apparatus of the embodiment of the present invention; FIG. 3 is a partially cross-sectional view of the electronic component mounting apparatus of the embodiment of the present invention; FIG. 4 is a descriptive view of a structure of a working unit attachment section in the electronic component mounting apparatus of the embodiment of the present invention; FIG. 5 is a structural descriptive view of a nozzle stocker of the electronic component mounting apparatus of the embodiment of the present invention; FIG. 6 is a structural descriptive view of a viscous material trial coater in the electronic component mounting apparatus of the embodiment of the present invention; FIG. 7 is an operation descriptive view of the viscous material trial coater of the electronic component mounting apparatus of the embodiment of the present invention.

A structure of an electronic component mounting apparatus is first described by reference to FIGS. 1, 2, and 3. The electronic component mounting apparatus is employed in an electronic component mounting line for producing a mounted substrate by mounting electronic components on a substrate and has a function of subjecting the substrate to predetermined operation. An example predetermined operation provided herein is an electronic component mounting apparatus having both a function of performing paste coating operation to coat a substrate with electronic component bonding paste and a function of performing component loading operation to load an electronic component taken out of a component feed section onto the substrate.

In FIG. 1 and FIG. 2, a substrate conveyance mechanism 2 having two conveyance paths 2a is set on a base 1 along an X direction (a direction of conveyance of a substrate). The conveyance paths 2a are provided with a substrate positioning section 3. A substrate 4 conveyed along the conveyance paths 2a by the substrate conveyance mechanism 2 is positioned at a work performance position, which is determined by a working mechanism to be described later, by means of the substrate positioning section 3 and supported and held from below.

Both sides of the substrate conveyance mechanism 2 serve as a working mechanism arrangement area where a working mechanism is placed. In the embodiment, a component loading mechanism 5A and a paste coating mechanism 5B are arranged in the working mechanism arrangement area. The component loading mechanism 5A has a function of loading an electronic component on the substrate 4, and the paste coating mechanism 5B has a function of coating the substrate 4 with paste for bonding an electronic component. The embodiment shows an example in which the component loading mechanism 5A is disposed on one side of the substrate conveyance mechanism 2 and in which the paste coating mechanism 5B is disposed on the other side. According to the configuration of the electronic component mounting line, there may also be a configuration in which any one of the component loading mechanism 5A and the paste coating mechanism 5B is disposed on either side of the substrate conveyance mechanism 2.

The configuration and function of the component loading mechanism 5A and the configuration and function of the paste coating mechanism 5B are described. A Y-axis moving table 11 having a linear drive mechanism is horizontally laid in a Y direction at one end of the base 1 in its X direction. The Y-axis moving table 11 includes, as a main body, a beam member 11a horizontally provided in an elongated pattern along the Y direction, and linear rails 12 are laid on the beam member 11a in the horizontal direction. Two rectangular coupling brackets 14A and 14B are attached to the linear rails 12 so as to be slidably in the Y direction by way of respective linear blocks 13.

Each of the coupling brackets 14A and 14B has a linear drive mechanism (see a stator 20 and a movable element 21 shown in FIG. 3). The coupling bracket 14A is coupled to a first X-axis moving table 15A having the same structure as that of the Y-axis moving table 11, and the coupling bracket 14B is coupled to a second X-axis moving table 15B having the same structure as that of the Y-axis moving table 11. A loading head 16 serving as a working head that subjects a substrate to operation is removably attached to the first X-axis moving table 15A by way of a rectangular attachment base 22A (see FIG. 3). A paste coating head 18 serving as a working head that subjects a substrate to operation is removably attached to the second X-axis moving table 15B by way of a rectangular attachment base 22B (see FIG. 3).

The component loading mechanism 5A disposed on a side of the substrate conveyance mechanism 2 close to a viewer is equipped with a component feed section 6, and a plurality of tape feeders 7 are fitted into the component feed section 6. Each of the tape feeders 7 performs pitch-feed of a carrier tape holding electronic components, thereby feeding the electronic component to a pickup position by means of a component loading mechanism to be described below. As shown in FIG. 3, the loading head 16 is a multiple head equipped with a plurality of unit loading heads 17 (eight unit loading heads in the embodiment). A suction nozzle 23 that holds an electronic component by suction is provided at a lower end of the individual unit loading head 17.

The suction nozzle 23 is elevated or lowered by a nozzle elevation mechanism built in the unit loading head 17 (see an arrowy direction "a"). The loading head 16 is moved in the direction X and the direction Y by actuation of the Y-axis moving table 11 and the X-axis moving table 15A. The suction nozzle 23 includes a nozzle shaft 23a that contacts and holds an electronic component in a sucking manner, a disc-shaped flange 23b that protrudes out of an upper portion of the nozzle shaft 23a in a horizontal direction; and an attachment base section 23c situated on the flange 23b. The suction nozzle 23 is removably attached to a corresponding unit loading head 17 by fitting the attachment base section 23c of the nozzle to a lower end of the unit loading head 17.

Each of the unit loading heads 17 takes an electronic component 24 out of the tape feeder 7 of the component feed section 6; transfers the electronic component to the substrate 4 positioned by the substrate positioning section 3; and loads the electronic component on a component mounting position set on the substrate 4. Therefore, the loading head 16 acts as a working head that subjects the substrate 4, which is positioned by the substrate positioning section 3, to component loading operation serving as predetermined operation. The Y-axis moving table 11 and the first X-axis moving table 15A act as a working head moving mechanism that moves the loading head 16, which has been selected as a working head from a plurality of types of working heads and which is replaceably attached, in order to let the loading head 16 perform component loading operation.

A component recognition unit 8 and a nozzle stocker 9 are arranged between the component feed section 6 and the conveyance paths 2a. When the loading head 16 that has taken the electronic component out of the component feed section 6 travels over the component recognition unit 8, the component recognition unit 8 captures an image of the electronic component held by the loading head 16, thereby recognizing the electronic component. The nozzle stoker 9 stores and holds the suction nozzles 23 replaceably attached to each of the unit loading heads 17 according to the type of electronic component. The loading head 16 accesses the nozzle stoker 9 and performs replacement of a nozzle, whereby the suction nozzle 23 commensurate with an electronic component to be mounted is attached to the individual unit loading head 17. As shown in FIG. 2, a substrate recognition camera 19 that travels integrally along with the loading head 16 is attached by way of the attachment base 22A while situated beneath the X-axis table 15A. The camera 19 travels to a position above the substrate 4 situated by the conveyance paths 2a along with the loading head 16, thereby capturing an image of a recognition mark provided on the substrate 4.

The paste coating head 18 that accommodates a coating unit 25 at a lower end of which a coating nozzle 25a is provided is replaceably attached to the attachment base 22B of the second X-axis table 15B. The coating unit 25 has a nozzle elevation mechanism that elevates or lowers the coating nozzle 25a. The paste coating head 18 is moved to a position above the substrate 4 positioned and held by the substrate positioning section 3. The coating nozzle 25a is elevated or lowered (an arrow "b"), to thus perform paste coating operation, whereby electronic component bonding paste 26 that is a viscous material is applied to a paste coating point on the substrate 4.

As shown in FIG. 4, the nozzle stocker 9 and a trial coating unit 10 exhibit replacement interchangeability and are replaceably attached to a working unit attachment section 30 previously placed within a range where the loading head 16 and the paste coating head 18 are moved by means of the foregoing working head moving mechanism. The working unit attachment section 30 has a horizontal attachment plate 33 that is held by post members 32 standing upright on a base section 31 fixed to an upper surface of the base 1. One of a plurality of types of working units having different functions is replaceably attached to the attachment plate 33. The working unit is for performing specific additional operation corresponding to working function of a working head that is selected from a plurality of types of working heads and that is replaceably attached to the attachment bases 22A and 22B.

The working unit attachment section 30 includes a cylinder 34 that is for actuating a working unit attached to the attachment plate 33 and that is placed in a horizontal position. A rod-shaped drive member 35 upwardly projects, in a vertical position, out of an end of a rod 34a of the cylinder 34. The rod 34a projects and recedes by actuation of the cylinder 34, whereby the drive member 35 horizontally travels, to thus actuate the working unit attached to the attachment plate 33.

A sensor unit 36 for identifying a working unit attached to the attachment plate 33 is provided on a side end face 33a on one side of the attachment plate 33. A dog unit 37 for letting the sensor unit 36 perform detection is placed at a position on a base 9a of the nozzle stocker 9 and a base 10a of the trial coating unit 10 that correspond to the sensor unit 36. A plurality of light block photosensors 36a, 36b, and 36c (three photosensors in the embodiment) are attached to the sensor unit 36. Dog members (two dog members 37a and 37b employed herein) for shielding the photosensors from light are attached to a position or positions on the dog unit 37 corresponding to any one or some of the plurality of photosensors 36a, 36b, and 36c. An arrangement of the dog members is previously specified according to the type of working unit.

When the working unit, such as the nozzle stocker 9 and the trial coating unit 10, is attached to the working unit attachment section 30, the dog unit 37 approaches the sensor unit 36 (as designated by an arrow "c"), whereby the dog members, such as the dog members 37a and 37b shield the respective, corresponding photosensors (the photosensors 36a and 36c in the embodiment) from light and outputs detection signals to a unit identification processing section 38. The unit identification processing section 38 identifies a type of working unit attached to the working unit attachment section 30 in accordance with the detection signals and transmits a result of identification to a control section 39. The control section 39 determines whether or not the working unit identified from the identification result is a correct working unit to be originally attached. On the basis of the determination result, it is determined whether or not the working head can perform operation in the electronic component mounting apparatus.

In the configuration, the sensor unit 36, the dog unit 37, and the unit identification processing section 38 make up working unit identification device that identifies the type of working unit attached to the working unit attachment section. The control section 39 serves as control device that determines, on the basis of a result of identification performed by the working unit identification device, whether or not the working head can perform operation. For instance, when the nozzle stocker 9 is determined to be attached, component loading operation is determined to be practicable. Further, when the trial coating unit 10 is determined to be attached, trial coating for applying paste is determined to be practicable.

By reference to FIG. 5, explanations are given to a structure and function of the nozzle stocker 9. In FIG. 5, accommodation pores 9b used for accommodating and holding the nozzle 23 in an upright position are opened, in a matrix pattern corresponding to an arrangement of the suction nozzle 23 attached to the loading head 16, in the base 9a that makes up a base section of the nozzle stocker 9 and that is attached to an upper surface of the attachment plate 33. A latch plate 41 having a shape that covers substantially the entirety of the base 9a is slidably placed on an upper surface of the base 9a while keeping clearance, which is larger than the thickness of the flange 23b, between the latch plate and the upper surface of the base 9a. A coupling member 42 inside of which a fitting pore 42a is provided is coupled to one end of the latch plate 41. An upper end of the drive member 35 that upwardly protrudes from an end of the rod 34a is fitted into the fitting pore 42a. The drive member 35 is reciprocally moved in the horizontal direction (as designated by an arrow "d") by actuation of the cylinder 34, whereby the latch plate 41 also reciprocally travels on the upper surface of the base 9a. The nozzle 23 is arranged so as to be able to slide the latch plate 41 while housed in the base 9a.

Nozzle insert openings 41a are opened, in the X direction, at positions on the latch plate 41 corresponding to respective rows of the matrix-patterned accommodation pores 9b in the base 9a. Latch claws 41b partially, inwardly extending from both sides are provided in the individual nozzle insert opening 41a in correspondence with each of the rows of the matrix-patterned accommodation pores 9b. A shape and a dimension of the individual nozzle insert opening 41a are set such that an opening crosswise dimension B1 becomes larger than a diameter D of the flange 23b of the nozzle 23 and that an inner dimension B2 between inwardly-protruding portions of the latch claws 41b becomes smaller than the diameter D.

Therefore, the nozzle 23 can be vertically inserted through the nozzle insert openings 41a in an area where the latch claws 41b are not provided in a protruding manner. Further, the nozzle 23 cannot be vertically inserted into any nozzle insert openings 41a in an area where the latch claws 41b protrude. In nozzle replacement operation for letting the loading head 16 approach the nozzle stocker 9 and replacing the suction nozzle 23, it is thereby possible to fixedly hold the suction nozzle 23 in the nozzle stocker 9 at required timing and allow release of the suction nozzle 23 from the nozzle stocker 9 at required timing.

A structure and a function of the trial coating unit 10 that is removably attached to the working unit attachment section 30 are now described by reference to FIG. 6. In the electronic component mounting apparatus used in an electronic component mounting line that mounts electronic components on a substrate, to thus manufacture a mounted substrate, the trial coating unit 10 is attached to the working unit attachment section 30 previously provided in the electronic component mounting apparatus, thereby making up a viscous material trial coater that performs trial coating of a viscous material prior to performance of coating operation for coating a substrate with the viscous material.

In FIG. 6, a coating stage 53 for letting the paste coating head 18 apply paste over a trial coating sheet 54 in a trial manner and a sheet feed mechanism 50 are arranged in the base 10a placed on an upper surface of the attachment plate 33. The sheet feed mechanism 50 has a function of feeding the sheet 54 to the coating stage 53 and includes a sheet feed reel 51 (a feed roll attachment section) to which there is removably fitted a feed roll 54a for feeding the sheet 54 in a rolled state and a sheet take-up reel 52 (a take-up roll attachment section) to which there is removably fitted a take-up roll 54b for taking up the sheet 54 withdrawn from the sheet feed reel 51 and subjected to trial coating in the coating stage 53.

A feed roll shaft 51a of the sheet feed reel 51 and a take-up roll shaft 52a of the sheet take-up reel 52 are axially supported by respective bearing blocks 61 and 62. The bearing block 61 has a built-in torque limiter mechanism. The bearing block 61 rotates only when experienced sheet withdrawal force of a predetermined level or more for withdrawing the sheet 54 exerted by the sheet take-up reel 52, thereby feeding the sheet 54 from the feed roll 54a. The bearing block 62 has a built-in one-way clutch mechanism for allowing rotation in only one direction, and rotation of the take-up roll shaft 52a in a releasing direction is thereby prevented. A pinion 63 for rotationally driving the take-up roll shaft 52a is coupled to a leading end of a portion of the take-up roll shaft 52a protruding out of the bearing block 62.

A guide rail 55 is laid, in the X direction, on an upper surface of the trial coating unit 10 and beneath the pinion 63. A rack 57 that meshes with the pinion 63 is coupled to a slider 56 that slidably fits to the guide rail 55. A coupling member 58 inside of which a fitting pore 58a is provided is coupled to a side surface of the rack 57 so as to protrude in the Y direction. The drive member 35 provided so as to upwardly extend from a leading end of the rod 34a is fitted into the fitting pore 58a. When the trial coating unit 10 is attached to the working unit attachment section 30, the trial coating unit 10 is positioned with respect to the attachment plate 33 such that the drive member 35 fits into the fitting hole 58a, and the base 10a is lowered with respect to the attachment plate 33.

In the state in which the trial coating unit 10 is thus attached, the cylinder 34 is actuated, to thus let the rod 34a protrude and recede, whereby the drive member 35 reciprocally travels (as designated by an arrow "f") in the horizontal direction. Reciprocal motion of the drive member 35 is transmitted to the rack 57 by way of the coupling member 58. As a result of the rack 57 being horizontally moved, rotational driving force is transmitted to the pinion 63. The pinion 63 has a built-in one-way clutch mechanism that allows rotation in one direction. Rotation in a sheet take-up direction (designated by an arrow "g") is transmitted to the take-up roll shaft 52a only when the rod 34a travels in a protruding direction. The drive member 35 and the coupling member 58 couple the sheet feed mechanism 50 to the cylinder 34 in a removably fitting manner, thereby making up drive transmission device that transmits driving force to the sheet feed mechanism 50. A state of the drive member 35 fitted into the fitting pore 58a is a fitted state having so-called margin for "play" originating from clearance between the drive member 35 and the fitting hole 58a in the direction of reciprocal movement. By means of appropriately setting the margin for play, an amount of rotation of the take-up roll shaft 52a for taking up the sheet 54 can be adjusted in connection with a configuration in which the cylinder 34 having a fixed stroke is adopted as a drive source.

The trial coater of the embodiment has a configuration including the trial coating unit (a removable unit) 10 removably attached to the working unit attachment section provided in the electronic component mounting apparatus; the coating stage 53 that is provided in the trial coating unit (the removable unit) 10 and that is for performing trial application of paste, which is a viscous material, over the trial coating sheet 54; the sheet feed mechanism 50 that is driven by the cylinder 34, which is provided in the working unit attachment section 30 and which acts as a drive source, and that feeds the sheet 54 to the coating stage 53; and the drive transmission device that removably couple the sheet feed mechanism 50 with the cylinder 34 in a fitting manner and that transmits drive force to the sheet feed mechanism 50.

The sheet feed mechanism 50 has the sheet feed reel 51 (a feed roll attachment section) to which there is removably fitted the feed roll 54a for feeding the sheet 54 in a rolled manner and the sheet take-up reel 52 (a take-up roll attachment section) to which there is removably fitted the take-up roll 54b for taking up the sheet 54 withdrawn from the sheet feed reel 51 and subjected to trial coating on the coating stage 53.

By reference to FIG. 7, there is now described trial coating operation that is performed for the trial coating unit 10 in the electronic component mounting apparatus. As shown in FIG. 7(a), the trial coating unit 10 is attached to the working unit attachment section 30, and the trial coater stays in an operable state. On occasion of performance of trial coating operation, the paste coating head 18 is moved to a position above the trial coating unit 10, and the coating nozzle 25a of the coating unit 25 is situated at a position above the coating stage 53. Next, the coating nozzle 25a is elevated or lowered (as designated by an arrow "h") with reference to the sheet 54 fed onto the coating stage 53, and the coating nozzle 25a performs trial coating of the paste 26.

A result of trial coating is now checked. Specifically, as shown in FIG. 7(b), the paste coating head 18 is moved, and the substrate recognition camera 19 is situated at a position above the paste 26 applied by means of trial coating, and the substrate recognition camera 19 captures an image of the paste 26. A recognition processing section (omitted from the drawings) recognizes an imaging result, thereby determining whether or not a state of paste coated by the coating nozzle 24a is successful.

There is exemplified an embodiment in which the trial coating unit 10 is subjected to trial coating intended for determining a coated state of paste. However, the trial coating unit 10 can be subjected to trial coating not for the purpose of determining a coated state but merely for removing paste fixed to the leading end of the coating nozzle 25a or can also be subjected to so-called "sacrificial coating" in which paste is applied for the sake of performing break-in operation prior to actual coating operation.

After trial coating has been carried out, sheet feeding is performed. Specifically, the cylinder 34 is actuated in a projecting direction of the rod 34a, to thus move the drive member 35 in the horizontal direction, as shown in FIG. 7(c) (as designated by an arrow "i"). The rack 57 is thereby shifted in the horizontal direction by the drive member 35 by way of the coupling member 58, and the pinion 63 is rotationally driven by the rack 57. Rotation of the pinion is transmitted to the sheet take-up reel 52 by way of the take-up roll shaft 52a (as designated by an arrow "j"), whereupon the sheet 54 is taken up by the sheet take-up reel 52 and fed in a sheet feed direction (designated by an arrow "k").

As described above, the electronic component mounting apparatus described in connection with the embodiment has the working unit attachment section 30 that is provided within a range in which a working head is moved by the working head moving mechanism and to which there is removably attached a working unit for performing specific, additional operation corresponding to a working function of the working head. When a single unit is diverted into a unit for different operation by replacement of a working head, a working unit for performing additional operation can thereby be replaced, so that operation for diverting the unit can readily be performed.

The viscous material trial coater described in connection with the embodiment is arranged so as to be removably attached to the working unit attachment section; hence, the trial coater can readily be replaced with another working unit, as required. Moreover, in the trial coater of the configuration, the feed roll 54a and the take-up roll 54b can be replaced while the trial coating unit 10 is removed from the working unit attachment section 30. Therefore, sheet replacement operation can be performed with superior operability. So long as the trial coater is equipped with a plurality of trial coating units 10, another trial coating unit 10 can be subjected to sheet replacement operation while one trial coating unit 10 is being used while attached to the viscous material trial coater, so that sheet replacement operation can be performed without stopping operation of the viscous material trial coater.

In the embodiment, the loading head 16 and the paste coating head 18 are provided as example working heads. Further, the nozzle stocker 9 and the trial coating unit 10 are provided as example working units for performing specific, additional operation corresponding to working functions of the working heads. The present invention can also be applied to a case where a working head of another type is used while attached to the electronic component mounting apparatus.

For instance, when an inspection imaging head equipped with an imaging unit for capturing an image of a substrate is used as a working head, a light quantity measurement reflection jig of a lighting unit provided in the imaging unit is attached, as a working unit for performing specific additional operation, to the working unit attachment section 30. Specifically, a reflection jig exhibiting a known reflectance property is attached to the working unit attachment section 30, and the imaging unit is caused to access the working unit attachment section 30 at predetermined intervals during activation of the imaging unit. A camera receives light reflected from the lighting unit, thereby measuring a state of time-lapse deterioration of the light source used in the lighting unit. When a substrate lower support unit of pin support type that supports a lower surface of a substrate by means of a pin is used as the substrate positioning section 3 provided in the substrate conveyance mechanism 2, a lower support pin stocker storing and holding a plurality of types of lower support pins can also be attached to the working unit attachment section 30.

The present invention is scheduled to be susceptible to various alterations and application conceived by those who are skilled in the art on the basis of descriptions of the specification and well-known technology without departing from the spirit and scope of the present invention, and the alterations and applications shall fall within a range where protection of the invention is sought.

The present invention is based on Japanese Patent Application (JP-A-2008-102271) filed on Apr. 10, 2008, the entire subject matter of which is incorporated herein by reference.

Industrial Applicability

The electronic component mounting apparatus of the present invention yields an advantage of being suitable for diversion of a single unit to a unit for different operation. The viscous material trial coater of the present invention also yields an advantage of enabling replacement of a working unit with a working unit of different type with superior operability. The electronic component mounting apparatus and the viscous material trial coater are useful in a field where a mounted substrate is manufactured by mounting electronic components on a substrate.

The invention claimed is:

1. An electronic component mounting apparatus that is used in an electronic component mounting line for producing a mounted substrate by mounting electronic components on a substrate and that subjects the substrate to a predetermined operation, the apparatus comprising:

a substrate conveyance mechanism for conveying the substrate along a conveyance path, a substrate positioning section provided along the conveyance path to position and hold the substrate, a working head that subjects the positioned substrate to the operation, and a working head moving mechanism for moving the working head, which has been selected from a plurality of types of working heads having different functions and is replaceably attached, in order to perform the operation; and a working unit attachment section that is provided within a range where the working head moving mechanism moves the selected working head and to which one of a plurality of types of working units having different functions is removably attached for performing a specific, additional operation according to a working function of the selected working head, wherein the plurality of types of working heads include a loading head for performing a component loading operation and a paste coating head for performing a paste coating operation.

2. The electronic component mounting apparatus according to claim 1, further comprising:

a working unit identification device for identifying a type of one of the plurality of types of working units attached to the working unit attachment section; and a control device that determines whether or not the working head can perform working operation on basis of an identification result of the working unit identification device.

* * * * *